(12) United States Patent
Paranthaman et al.

(10) Patent No.: US 6,764,770 B2
(45) Date of Patent: Jul. 20, 2004

(54) BUFFER LAYERS AND ARTICLES FOR ELECTRONIC DEVICES

(75) Inventors: Mariappan P. Paranthaman, Knoxville, TN (US); Tolga Aytug, Oak Ridge, TN (US); David K. Christen, Oak Ridge, TN (US); Roeland Feenstra, Knoxville, TN (US); Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 10/324,883

(22) Filed: Dec. 19, 2002

(65) Prior Publication Data

US 2004/0121191 A1 Jun. 24, 2004

(51) Int. Cl.[7] ............................. B32B 15/04; B32B 9/04
(52) U.S. Cl. ...................... 428/469; 428/697; 428/699; 428/701; 428/702; 505/237; 505/238; 505/239
(58) Field of Search ................................. 428/469, 697, 428/679, 701, 702; 505/237, 238, 239

(56) References Cited

U.S. PATENT DOCUMENTS

| | | | |
|---|---|---|---|
| 5,739,086 A | 4/1998 | Goyal et al. | |
| 5,741,377 A | 4/1998 | Goyal et al. | |
| 5,898,020 A | 4/1999 | Goyal et al. | |
| 5,944,966 A | 8/1999 | Suetsugu et al. | |
| 5,958,599 A | 9/1999 | Goyal et al. | |
| 5,968,877 A | 10/1999 | Budai et al. | |
| 5,972,847 A | 10/1999 | Feenstra et al. | |
| 6,150,034 A | 11/2000 | Paranthaman et al. | |
| 6,156,376 A | 12/2000 | Paranthaman et al. | |
| 6,159,610 A | 12/2000 | Paranthaman et al. | |
| 6,270,908 B1 | 8/2001 | Williams et al. | |
| 6,296,701 B1 | 10/2001 | Christen et al. | |
| 6,309,767 B1 * | 10/2001 | Nies ........................... | 428/689 |
| 6,399,154 B1 | 6/2002 | Williams et al. | |
| 6,537,689 B2 * | 3/2003 | Schoop et al. .............. | 428/701 |
| 6,617,283 B2 * | 9/2003 | Paranthaman et al. ...... | 505/238 |

OTHER PUBLICATIONS

Goyal et al., Material Characteristics of perovskite manganese oxide thin films for bolometric applications, Oct. 27, 1997, Appl. Phys. Lett, 71(17) pp. 2535–2537.*

Tomioka et al., "Anomaolus Magnetotransport Properties of Pr1–xCaxMnO3", Journal of the Physical Society of Japan, vol. 64, No. 10, Oct. 1995, pp 3626–3630.*

* cited by examiner

Primary Examiner—Stephen Stein
(74) Attorney, Agent, or Firm—Joseph A. Marasco

(57) ABSTRACT

Materials for depositing buffer layers on biaxially textured and untextured metallic and metal oxide substrates for use in the manufacture of superconducting and other electronic articles comprise $RMnO_3$, $R_{1-x}A_xMnO_3$, and combinations thereof; wherein R includes an element selected from the group consisting of La, Ce, Pr, Nd, Pm, Sm, Eu, Gd, Tb, Dy, Ho, Er, Tm, Yb, Lu, and Y, and A includes an element selected from the group consisting of Be, Mg, Ca, Sr, Ba, and Ra.

22 Claims, 12 Drawing Sheets

FIG. 9

| $REBa_2Cu_3O_{7-\delta}$ |
|---|
| $RMnO_3$, where R is any one of Ce, Pr, Nd, Pm, Sm, Eu, Gd, Tb, Dy, Ho, Er, Tm, Yb, Lu, and Y |

FIG. 10

| Any Superconductor |
|---|
| $RMnO_3$, where R is any one of Ce, Pr, Nd, Pm, Sm, Eu, Gd, Tb, Dy, Ho, Er, Tm, Yb, Lu and Y |

FIG. 11

| $REBa_2Cu_3O_{7-\delta}$ or any HTS |
|---|
| $RMnO_3$, where R is any one of Ce, Pr, Nd, Pm, Sm, Eu, Gd, Tb, Dy, Ho, Er, Tm, Yb, Lu, and Y |
| Biaxially Textured Metal/Alloy |

FIG. 12

| $REBa_2Cu_3O_{7-\delta}$ or any HTS |
|---|
| $RMnO_3$, where R is any one of Ce, Pr, Nd, Pm, Sm, Eu, Gd, Tb, Dy, Ho, Er, Tm, Yb, Lu, and Y |
| At least one Biaxially Textured Buffer Layer such as MgO made by IBAD, ISD, ITEX, etc. |

FIG. 13

| $REBa_2Cu_3O_{7-\delta}$ or any HTS |
|---|
| $RMnO_3$, where R is any one of Ce, Pr, Nd, Pm, Sm, Eu, Gd, Tb, Dy, Ho, Er, Tm, Yb, Lu, and Y |
| At least one Biaxially Textured Buffer Layer such as MgO made by IBAD, ISD, ITEX, etc. |
| Polycrystalline metal/alloy tape which is not biaxially textured |

FIG. 14

| REBa$_2$Cu$_3$O$_{7-\delta}$ or any HTS |
|---|
| RMnO$_3$, where R is any one of Ce, Pr, Nd, Pm, Sm, Eu, Gd, Tb, Dy, Ho, Er, Tm, Yb, Lu, and Y |
| Single-crystal substrate such as MgO |

BUFFER LAYERS AND ARTICLES FOR ELECTRONIC DEVICES

This invention was made with Government support under Contract No. DE-AC05-00OR22725 awarded by the United States Department of Energy. The Government has certain rights in the invention.

FIELD OF THE INVENTION

The present invention relates to materials and methods for depositing buffer layers on biaxially textured and untextured metallic and metal oxide substrates for use in the manufacture of superconducting and other electronic articles, and more particularly to substrates comprising $RMnO_3$, $R_{1-x}A_xMnO_3$, and combinations thereof wherein R comprises an element selected from the group consisting of La, Ce, Pr, Nd, Pm, Sm, Eu, Gd, Tb, Dy, Ho, Er, Tm, Yb, Lu, and Y, and A comprises an element selected from the group consisting of Be, Mg, Ca, Sr, Ba, and Ra.

BACKGROUND OF THE INVENTION

One standard architecture for the ion-beam assisted deposition (IBAD) based $Y—Ba_2—Cu_3—O_x$ (YBCO) coated conductors utilizing $CeO_2$, yttria stabilized zirconia (YSZ), and MgO is YBCO/$CeO_2$/YSZ/MgO(BAD)/Ni-alloy. Since very thin MgO (IBAD) layers are sufficient to get the necessary biaxial texture, it is essential to provide a simplified buffer layer architecture to grow YBCO films. Thinner buffers are needed to increase the engineering critical current density of the YBCO coated conductors. Another alternative architecture utilizing inclined substrate deposition (ISD) deposition is YBCO/$CeO_2$/YSZ/MgO(ISD)/Ni-alloy. The reaction of the $CeO_2$ with YBCO always results in the formation of $BaCeO_3$ at the buffer/YBCO interface. From previous demonstrations of the growth of YBCO films on $LaMnO_3$-buffered Ni substrates, we expected that the interface between $LaMnO_3$ (LMO) and YBCO should be perfect.

The fabrication of YBCO coated conductors requires an economic and robust process to produce the YBCO superconductor layer. The $BaF_2$ ex situ (BF) method requires two distinct processing steps whereby first a non-superconducting precursor layer is deposited onto the substrate and this precursor layer is subsequently annealed in a furnace to form the superconducting YBCO. The two steps may facilitate economic scale-up for long length coated conductor fabrication. On a suitable substrate or buffer layer, using the BF method, the YBCO can be grown as an epitaxial layer with high critical current density ($J_c$). However, many buffer layer materials or substrates exhibit a deleterious chemical reactivity toward the precursor layer during the ex situ anneal to the extent that a high-$J_c$ epitaxial YBCO film cannot be obtained. Previously, a suitable buffer layer had been identified in the form of thin ceria, $CeO_2$. This material exhibits a moderate reactivity toward the precursor layer (leading to the reaction product barium cerate, $BaCeO_3$). The use of $CeO_2$ as a single buffer layer on metallic substrates is restricted to metal (Ni) diffusion through the $CeO_2$ into the YBCO. LMO appears to exhibit a reduced reactivity toward the BF precursor during the ex situ anneal, making it easier to form epitaxial, high-$J_c$ YBCO layers. It has also been demonstrated that LMO provides a barrier against Ni diffusion and can be used as a single buffer layer. Previously, a layer of YSZ was used to provide a diffusion barrier. On this YSZ, a thin layer of $CeO_2$ was required to enable compatibility with the BF ex situ process. A single LMO layer was expected to replace both the YSZ and $CeO_2$ layers and possibly even the first seed layers.

$LaMnO_3$ perovskite (LMO) has been extensively studied in the past years, since it is the parent compound of the family of oxides $La_{1-x}A_xMnO_3$ (A may be any alkaline earth metal), showing interesting properties such as colossal magnetoresistance or charge-ordering. In this family, the replacement of La for divalent A cations, oxides $Mn^{3+}$ to $Mn^{4+}$, introducing holes in the Mn3d band and gives rise to metallic and/or ferromagnetic behavior. Even in the absence of chemical doping, $LaMnO_3$ shows the ability to accommodate the so-called oxidative-nonstoichiometry, which also involves the partial oxidation of $Mn^{3+}$ to $Mn^{4+}$ cations in samples of global composition $LaMnO_{3+\delta}$. In fact the insertion of oxides is not possible in the perovskite structure, and the nonstoichiometry is incorporated via cation vacancies.

Recent work has demonstrated that $LaMnO_3$ and (La,Sr)$MnO_3$ perovskites are good buffer layers for growth of superconductors such as YBCO. This work suggests that LMO could be used as a single buffer layer on Ni and Ni—W substrates for growth of YBCO by either pulsed laser ablation or the ex-situ BF technique. It was also demonstrated that LMO could be grown epitaxially on MgO single crystal. This is important since it enables growth of such buffer layers on ion-beam assisted deposition (IBAD) or (ISD) produced, biaxially textured MgO on untextured metal substrates. However the YBCO films grown in these demonstrations on LMO buffers were very thin—only 0.2 $\mu$m to 0.3 $\mu$m. What would happen when thicker films, several microns in thickness are grown was desired to be known. Especially for techniques such as the ex-situ BF technique, where incipient liquid phases are involved, substitution of La into the YBCO was of interest. Also, whether LMO buffers would work with every deposition process and superconductor-type such as REBCO or Ti-based or Hg-based superconductors was of interest. It had long been desired to exploit the relative chemical inertness of LMO buffer layers and the possibility of obtaining electrically conducting buffer layers by doping of the La site in a very flexible and broad manner. The present invention provides this much-needed flexibility.

The following U.S. Patents and U.S. Patent Application(s) contain information which is relevant to the present invention, and the disclosure of each is hereby incorporated by reference: U.S. Pat. No. 5,739,086 to Goyal et al. dated Apr. 14, 1998, U.S. Pat. No. 5,741,377 to Goyal et al. dated Apr. 21, 1998, U.S. Pat. No. 5,898,020 to Goyal et al. dated Apr. 27, 1999, U.S. Pat. No. 5,958,599 to Goyal et al. dated Sep. 28, 1999, U.S. Pat. No. 5,944,966 to Suetsugu et al. dated Aug. 31, 1999, U.S. Pat. No. 5,968,877 to Budai et al. dated Oct. 19, 1999, U.S. Pat. No. 6,296,701 B1 to Christen et al. dated Oct. 2, 2001, U.S. Pat. No. 5,972,847 to Feenstra et al. dated Oct. 26, 1999, U.S. Pat. No. 6,150,034 to Paranthaman et al. dated Nov. 21, 2000, U.S. Pat. No. 6,156,376 to Paranthaman et al. dated Dec. 5, 2000, U.S. Pat. No. 6,159,610 to Paranthaman et al. dated Dec. 12, 2000, U.S. Pat. No. 6,270,908 B1 to Williams et al. dated Aug. 7, 2001, U.S. Pat. No. 6,399,154 B1 to Williams et al. dated Jun. 4, 2002, and U.S. patent application Ser. No. 09/563,665 by Goyal et al. filed May 2, 2000.

OBJECTS OF THE INVENTION

Accordingly, it is an object of the present invention to provide new and improved materials and methods for depositing buffer layers on biaxially textured and untextured metallic and metal oxide subsumes for use in the manure of superconducting and other electronic articles. It is a further object to provide new and improved materials and methods for depositing buffer layer substrates comprising $RMnO_3$, $R_{1-x}A_xMnO_3$, and combinations thereof, wherein R is an element selected from the group consisting of La, Ce, Pr, Nd, Pm, Sm, Eu, Gd, Tb, Dy, Ho, Er, Tm, Yb, Lu, and Y, and A is an element selected from the group consisting of Be, Mg, Ca, Sr, Ba, and Ra.

Further and other objects of the present invention will become apparent from the description contained herein.

SUMMARY OF THE INVENTION

In accordance with one aspect of the present invention, the foregoing and other objects are achieved by a buffered substrate for electronic devices which comprises a substrate selected from the group consisting of biaxially textured metals, biaxially textured metal alloys, and biaxially textured metal oxides, the substrate having at least one surface, and a buffer layer deposited epitaxially upon a surface of the substrate, the buffer layer being selected from the group consisting of $RMnO_3$, $R_{1-x}A_xMnO_3$, and combinations thereof, wherein R is an element selected from the group consisting of La, Ce, Pr, Nd, Pm, Sm, Eu, Gd, Tb, Dy, Ho, Er, Tm, Yb, Lu, and Y, and A is an element selected from the group consisting of Be, Mg, Ca, Sr, Ba, and Ra.

In accordance with a second aspect of the present invention, the foregoing and other objects are achieved by a buffered substrate for electronic devices which comprises a substrate selected from the group consisting of biaxially textured metals, biaxially textured metal alloys, and biaxially textured metal oxides, the substrate having at least one surface, at least one biaxially textured buffer layer epitaxially deposited upon a surface of the substrate, and an additional buffer layer deposited epitaxially upon a surface of the biaxially textured buffer layer, the additional buffer layer selected from the group consisting of $RMnO_3$, $R_{1-x}A_xMnO_3$, and combinations thereof, wherein R is an element selected from the group consisting of La, Ce, Pr, Nd, Pm, Sm, Eu, Gd, Tb, Dy, Ho, Er, Tm, Yb, Lu, and Y, and A is an element selected from the group consisting of Be, Mg, Ca, Sr, Ba, and Ra.

In accordance with a third aspect of the present invention, the foregoing and other objects are achieved by a buffered substrate for electronic devices which comprises a substrate selected from the group consisting of metals and metal alloys, the substrate having a surface characterized by non-biaxial texture, at least one biaxially textured buffer layer epitaxially deposited upon the surface of the substrate, and an additional buffer layer deposited epitaxially upon a surface of the biaxially textured buffer layer, the additional buffer layer being selected from the group consisting of $RMnO_3$, $R_{1-x}A_xMnO_3$, and combinations thereof, wherein R is an element selected from the group consisting of La, Ce, Pr, Nd, Pm, Sm, Eu, Gd, Tb, Dy, Ho, Er, Tm, Yb, Lu, and Y, and A is an element selected from the group consisting of Be, Mg, Ca, Sr, Ba, and Ra.

In accordance with a fourth aspect of the present invention, the foregoing and other objects are achieved by a buffered substrate for electronic devices which comprises a single crystal substrate, the substrate having at least one surface, and a buffer layer deposited epitaxially upon a surface of the single crystal substrate, the buffer layer being selected from the group consisting of $RMnO_3$, $R_{1-x}A_xMnO_3$, and combinations thereof, wherein R is an element selected from the group consisting of La, Ce, Pr, Nd, Pm, Sm, Eu, Gd, Tb, Dy, Ho, Er, Tm, Yb, Lu, and Y, and A is an element selected from the group consisting of Be, Mg, Ca, Sr, Ba, and Ra.

In accordance with a fifth aspect of the present invention, the foregoing and other objects are achieved by an electronic device which comprises a substrate selected from the group consisting of biaxially textured metals, biaxially textured metal alloys, and biaxially textured metal oxides, the substrate having at least one surface, a buffer layer deposited epitaxially upon a surface of the substrate, the buffer layer selected from the group consisting of $RMnO_3$, $R_{1-x}A_xMnO_3$, and combinations thereof, wherein R comprises an element selected from the group consisting of La, Ce, Pr, Nd, Pm, Sm, Eu, Gd, Tb, Dy, Ho, Er, Tm, Yb, Lu, and Y, and A comprises an element selected from the group consisting of Be, Mg, Ca, Sr, Ba, and Ra, and at least one electronic device deposited upon a surface of the buffer layer, the electronic device being selected from the group consisting of $REBa_2Cu_3O_7$, a superconductor, a semiconductor, and a ferroelectric material.

In accordance with a sixth aspect of the present invention, the foregoing and other objects are achieved by an electronic device which comprises a substrate selected from the group consisting of biaxially textured metals, biaxially textured metal alloys, and biaxially textured metal oxides, the substrate having at least one surface, at least one biaxially textured buffer layer epitaxially deposited upon a surface of the substrate, an additional buffer layer deposited epitaxially upon a surface of the biaxially textured buffer layer, the additional buffer layer being selected from the group consisting of $RMnO_3$, $R_{1-x}A_xMnO_3$, and combinations thereof, wherein R comprises an element selected from the group consisting of La, Ce, Pr, Nd, Pm, Sm, Eu, Gd, Tb, Dy, Ho, Er, Tm, Yb, Lu, and Y, and A comprises an element selected from the group consisting of Be, Mg, Ca, Sr, Ba, and Ra, and at least one electronic device deposited upon a surface of the additional buffer layer, the electronic device being selected from the group consisting of $REBa_2Cu_3O_7$, a superconductor, a semiconductor, and a ferroelectric material.

In accordance with a seventh aspect of the present invention, the foregoing and other objects are achieved by an electronic device which comprises a substrate selected from the group consisting of metals and metal alloys, the substrate having a surface characterized by non-biaxial texture, at least one biaxially textured buffer layer epitaxially deposited upon a surface of the substrate, an additional buffer layer deposited epitaxially upon a surface of the biaxially textured buffer layer, the additional buffer layer being selected from the group consisting of $RMnO_3$, $R_{1-x}A_xMnO_3$, and combinations thereof, wherein R comprises an element selected from the group consisting of La, Ce, Pr, Nd, Pm, Sm, Eu, Gd, Tb, Dy, Ho, Er, Tm, Yb, Lu, and Y, and A comprises an element selected from the group consisting of Be, Mg, Ca, Sr, Ba, and Ra, and at least one electronic device deposited upon a surface of the additional buffer layer, the electronic device being selected from the group consisting of $REBa_2Cu_3O_7$, a superconductor, a semiconductor, and a ferroelectric material.

In accordance with an eighth aspect of the present invention, the foregoing and other objects are achieved by an electronic device which comprises a single crystal substrate, the substrate having at least one surface, a buffer layer deposited epitaxially upon a surface of the single crystal substrate, the buffer layer selected from the group consisting of $RMnO_3$ $R_{1-x}A_xMnO_3$, and combinations thereof wherein R comprises an element selected from the group consisting of La, Ce, Pr, Nd, Pm, Sm, Eu, Gd, Tb, Dy, Ho, Er, Tm, Yb, Lu, and Y, and A comprises an element selected from the group consisting of Be, Mg, Ca, Sr, Ba, and Ra, and at least one electronic device deposited upon a surface of the buffer layer, the electronic device being selected from the group consisting of $REBa_2Cu_3O_7$, a superconductor, a semiconductor, and a ferroelectric material.

BRIEF DESCRIPTION OF THE DRAWINGS

In the drawings:

FIGS. 9, 10, 11, 12, 13, and 14 show various architectural combinations utilizing $RMnO_3$ where R is any one of Ce, Pr, Nd, Pm, Sm, Eu, Gd, Tb, Dy, Ho, Er, Tm, Yb, Lu, or Y.

Figure 1B:
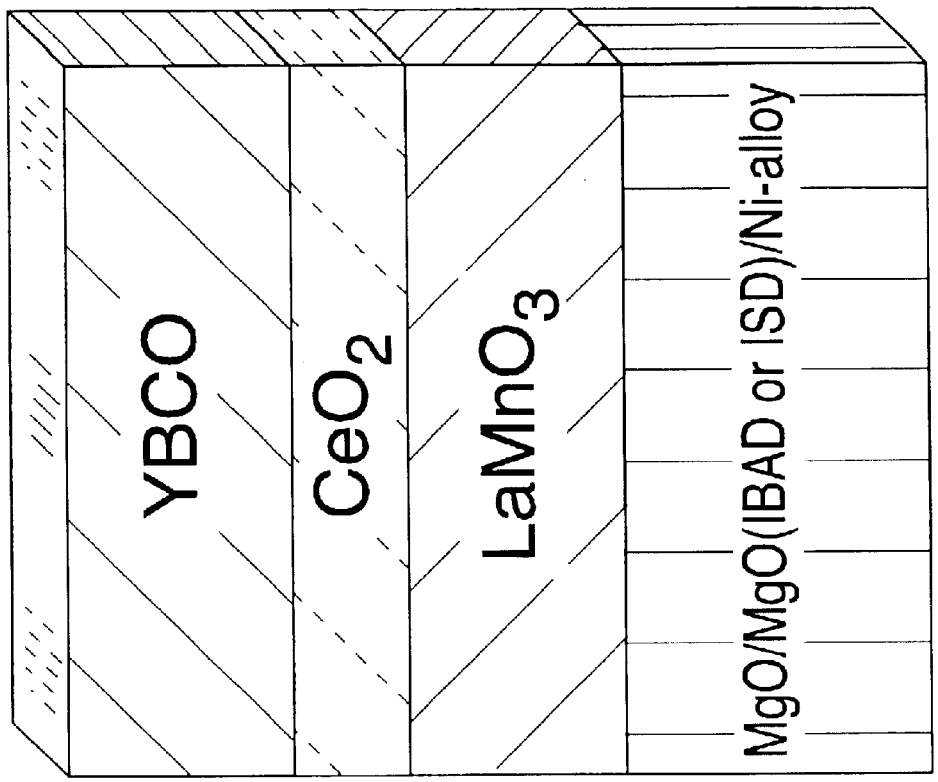
FIG. 1 is a schematic diagram showing the possibility of developing various buffer layer architectures on MgO templates.

For a better understanding of the present invention, together with other and further objects, advantages and capabilities thereof reference is made to the following disclosure and appended claims in connection with the above-described drawings.

DETAILED DESCRIPTION OF THE INVENTION

The first work in the present invention is the development of a suitable buffer layer architecture using lanthanum manganate (LMO) as the buffer layer. The architecture comprises the layer sequence of YBCO/LMO/MgO(IBAD or ISD). These MgO (IBAD and ISD) templates are biaxially textured. To test the compatibility with MgO templates, initially the LMO buffer layer was epitaxially grown on MgO (100) single crystal substrates. The LMO buffer layers were continuous and crack-free. The YBCO layers were then grown on LMO-buffered MgO (100) substrates by both pulsed laser deposition (PLD) and BF process. The YBCO films carried a transport current density, $J_c$ of over 4 $MA/cm^2$ at 77K and self-field. X-ray indicated the presence of a single cube textured YBCO film. Following up with these experiments, MgO-IBAD templates were obtained and on these substrates LMO layers have been successfully grown by rf magnetron sputtering. Further on LMO-buffered MgO (IBAD) substrates, YBCO films have been epitaxially grown that carried a $J_c$ of 670,000 $A/cm^2$ at 77K. Thus the concept of using LMO buffers on MgO templates has been proven. Similar to LMO, other suitable buffers such as $La_{1-x}A_xMnO_3$ (where x is 0 to 0.8, and A may be Ca, Sr, or Ba) may be used.

EXAMPLE I

Growth of LMO on MgO Templates by Sputtering Followed by YBCO Deposition

Either MgO (100) single crystal substrates or MgO (IBAD) substrates were mounted on a heater block using Ag paint and loaded into the vacuum chamber for on-axis sputtering. The LMO buffer layer depositions were performed with an rf-magnetron sputtering system of base pressure $1\times10^{-6}$ Torr, using oxide sputter targets that were 95 mm in diameter and a power of 67 Watt. Unlike the sintered and hard-pressed $CeO_2$ and YSZ targets, the LMO target was made from a single-phase LMO powder, which was lightly packed into a copper tray. Deposition of LMO layer was accomplished at substrate temperatures ranging from 550° C. to 700° C. in the presence of Argon and/or Argon-$H^2$ (4%) mixture. Oxygen was not added intentionally. In some runs, controlled water was added into the system to produce stoichiometric LMO films. The deposition rate was about 0.71 Å/sec. The LMO film thickness was varied in the range 200 nm to 300 nm to investigate the effect on the microstructure and on the superconducting properties of the subsequent high temperature superconducting (HTS) layer. The sputtering pressure was around 3 mTorr. In addition, it is possible to sputter LMO buffers in the presence of low $pO_2$.

The PLD technique was employed for deposition of the YBCO films, using a KrF excimer laser system, operated with an energy density of about 4 $J/cm^2$. During deposition of the YBCO films, the substrates were kept at between 780° C. and 800° C. in 120 mTorr of $O_2$. After deposition, the samples were first cooled to 600° C. at a rate of 5° C./min; then the $O_2$ pressure was increased to 550 Torr, and the samples cooled to room temperature at the same rate. Typical film thicknesses of YBCO coating were 200 nm.

The BF process was also employed for deposition of the YBCO films. The YBCO precursors were deposited using co-electron beam evaporation of Y, $BaF_2$, and Cu. These precursors were post-annealed under standard controlled oxygen and humidity atmospheres at a temperature of 740° C. Typical film thicknesses of YBCO using this process were 330 nm.

The films were analyzed by X-ray diffraction. A Philips model XRG3100 diffractometer with $CuK_\alpha$ radiation was used to record powder diffraction patterns. SEM micrographs were taken using a JOEL JSM-840. The thickness of both buffers and YBCO films were determined by both Rutherford backscattering spectroscopy (RBS) and Alpha Step profilometer scans. The resistivity and transport critical current density, $J_c$ was measured using a standard four-probe technique. Electrical contacts of Ag were deposited onto the samples using dc sputtering followed by an $O_2$ annealing in 1 atm for 30 minutes at 500° C. Values of $J_c$ were calculated using a 1-$\mu$V/cm criterion.

Figure 1A:
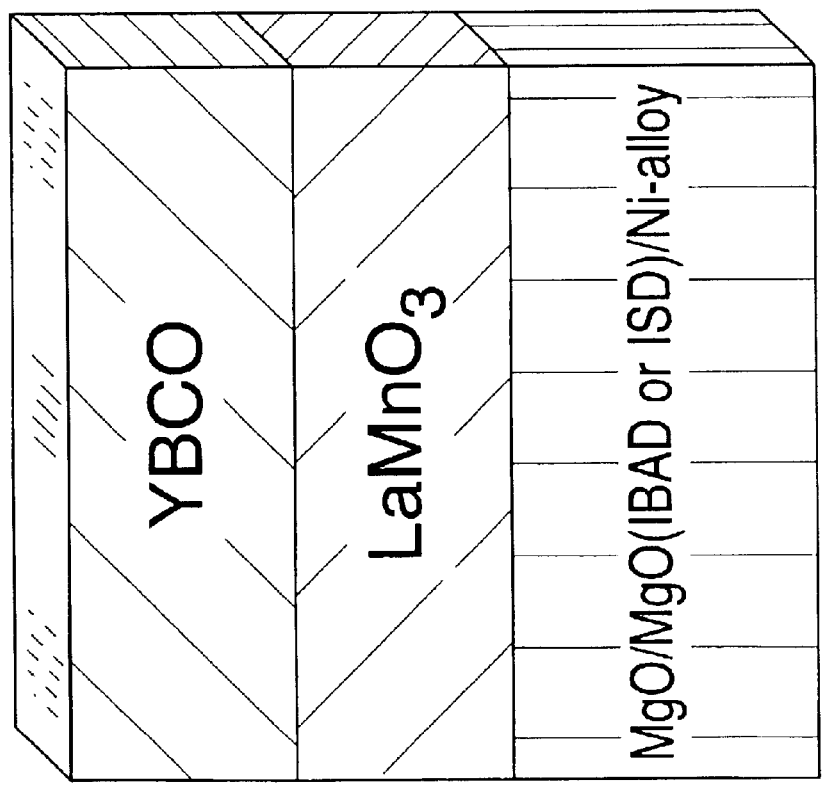
Figure 2:
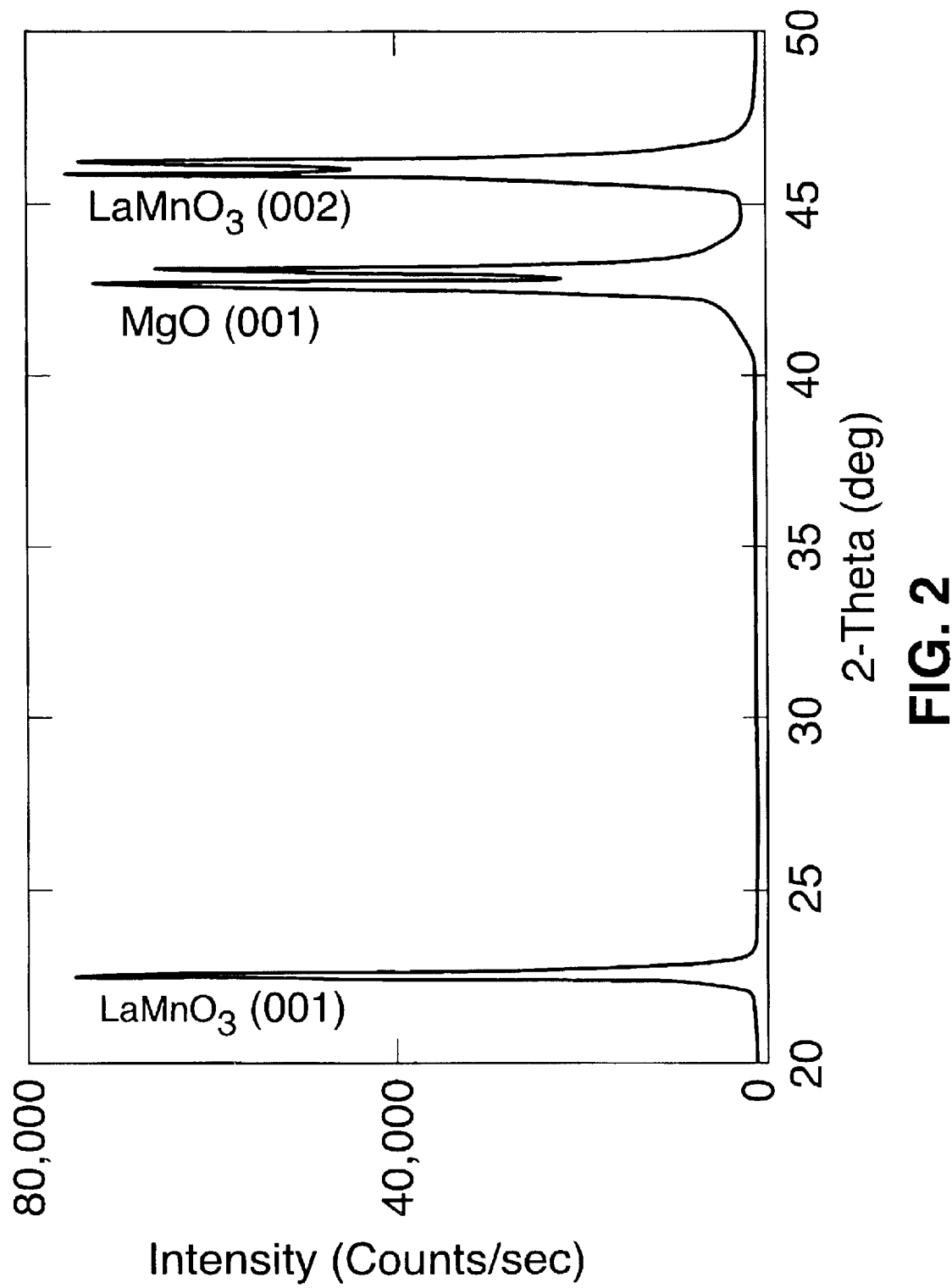
FIG. 2 is a typical θ-2θ scan for a 200 nm thick LMO film on MgO (100) single crystal substrates. The figure indicates the presence of a c-axis LMO aligned film.
Figure 3:
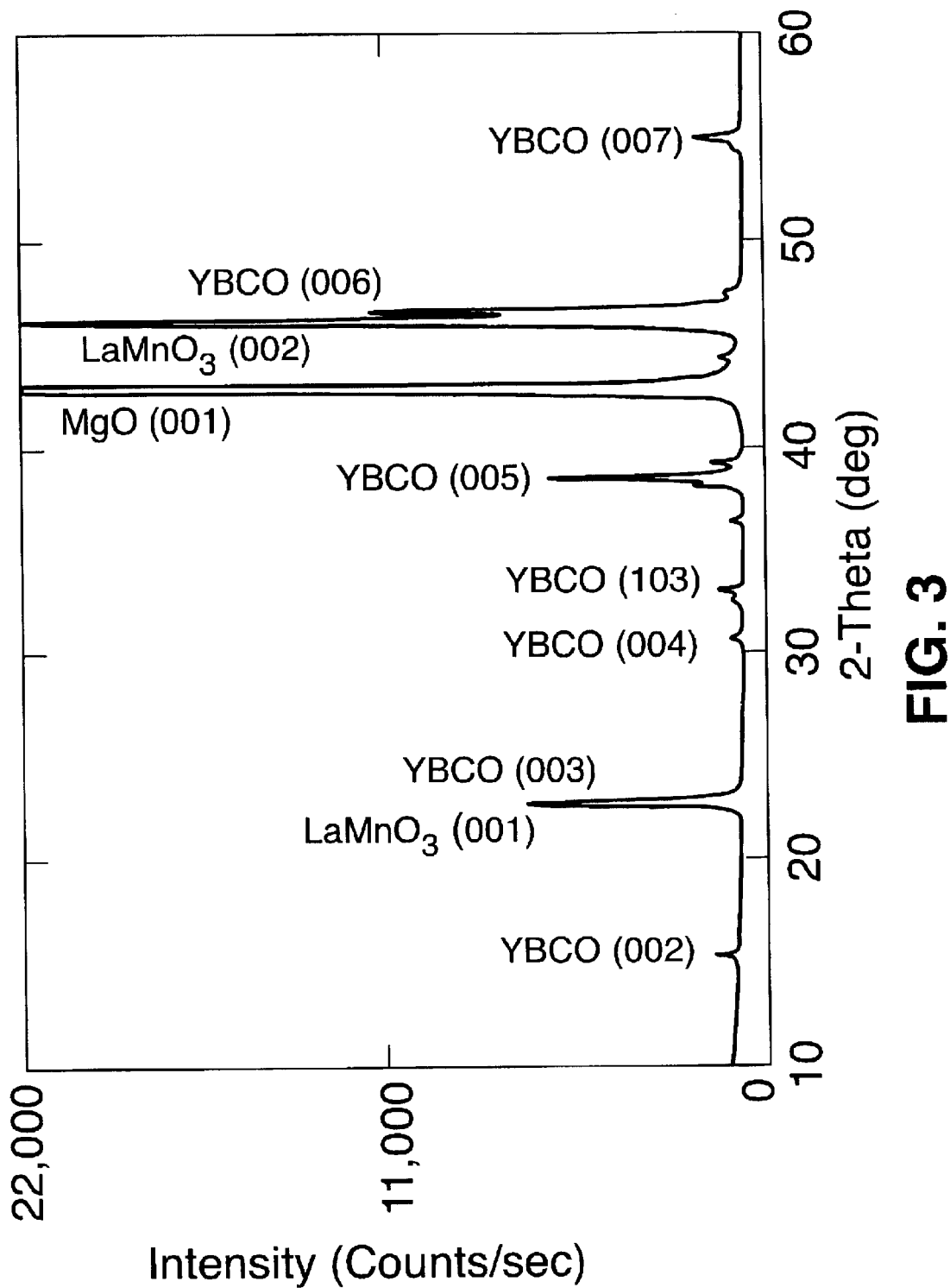
FIG. 3 is a typical θ-2θ scan for a 200 nm thick YBCO film on LMO-buffered MgO(100) single crystal substrates. The figure indicates the presence of a c-axis aligned YBCO film.
Figure 4:
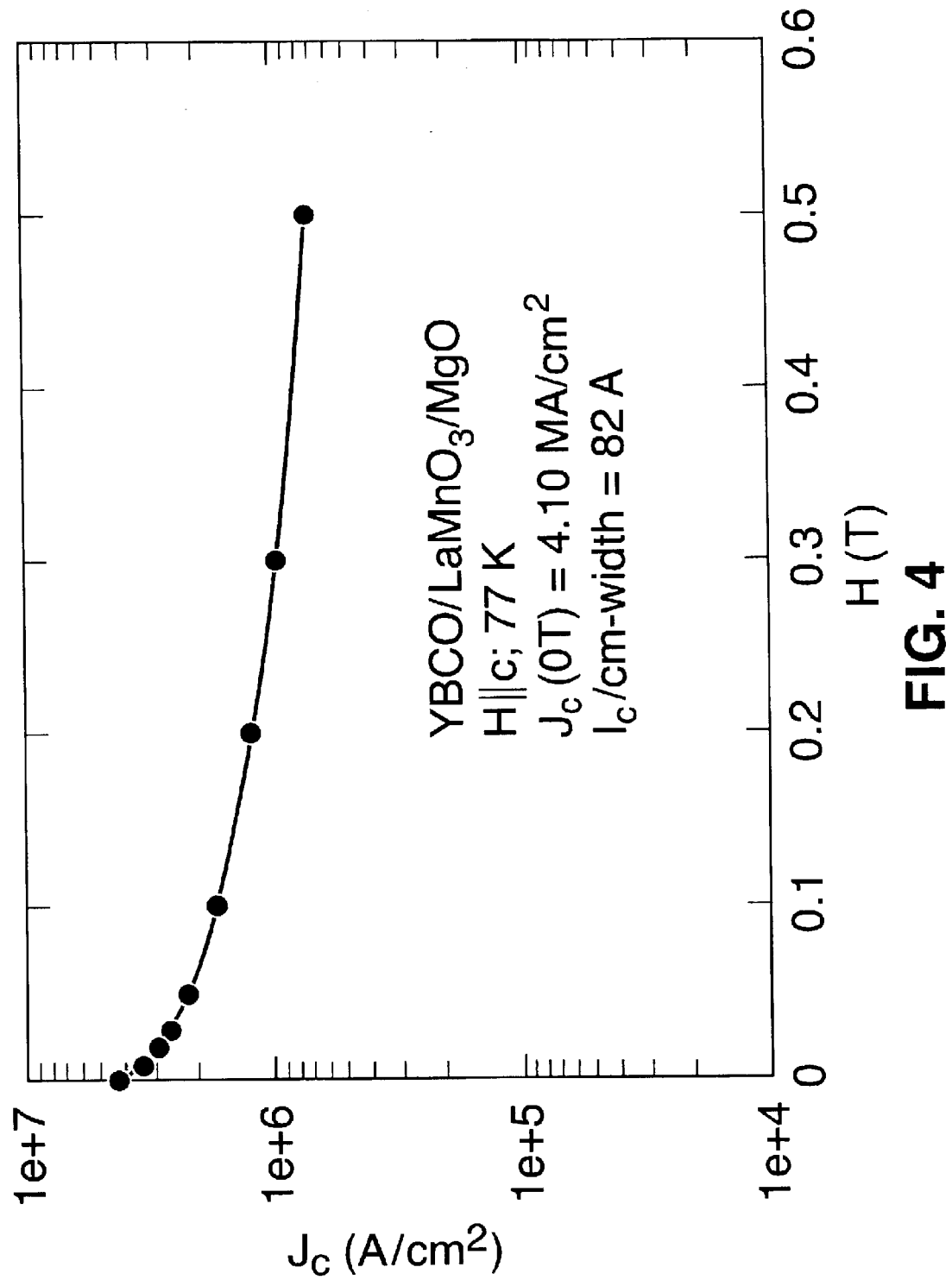
FIG. 4 shows the field dependence of critical current density, $J_c$ for a 200 nm thick PLD YBCO film on 200 nm thick LMO buffered MgO (100) single crystal substrates.
Figure 5:
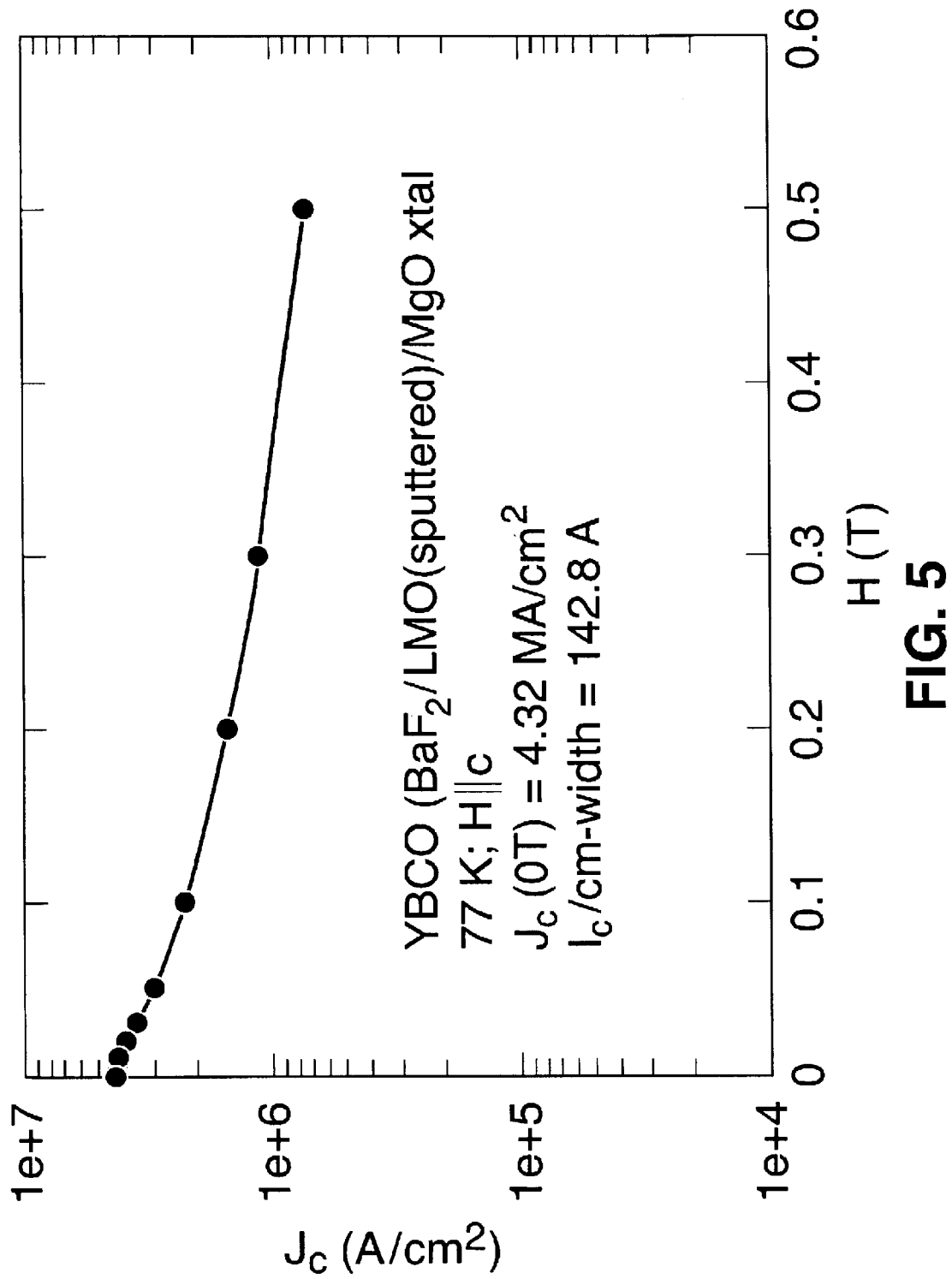
FIG. 5 shows the field dependence of critical current density, $J_c$ for a 330 nm thick YBCO film grown using ex-situ $BaF_2$ process on 200 nm thick LMO buffered MgO (100) single crystal substrates.
Figure 6:
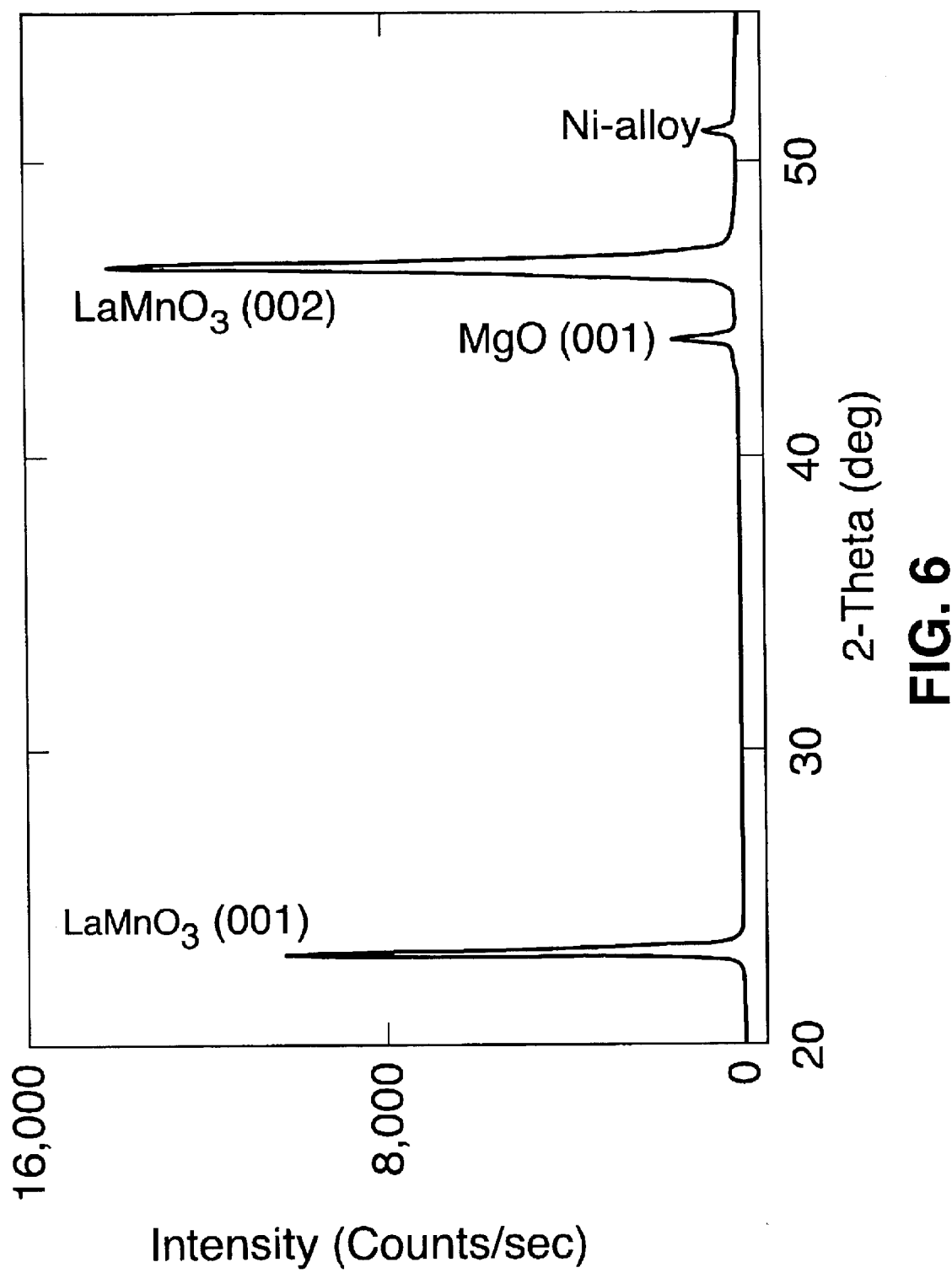
FIG. 6 is a typical θ-2θ scan for a 200 nm thick MLO film on MgO (IBAD)/Ni-alloy substrates. The figure indicates the presence of a c-axis LMO aligned film.
Figure 7:
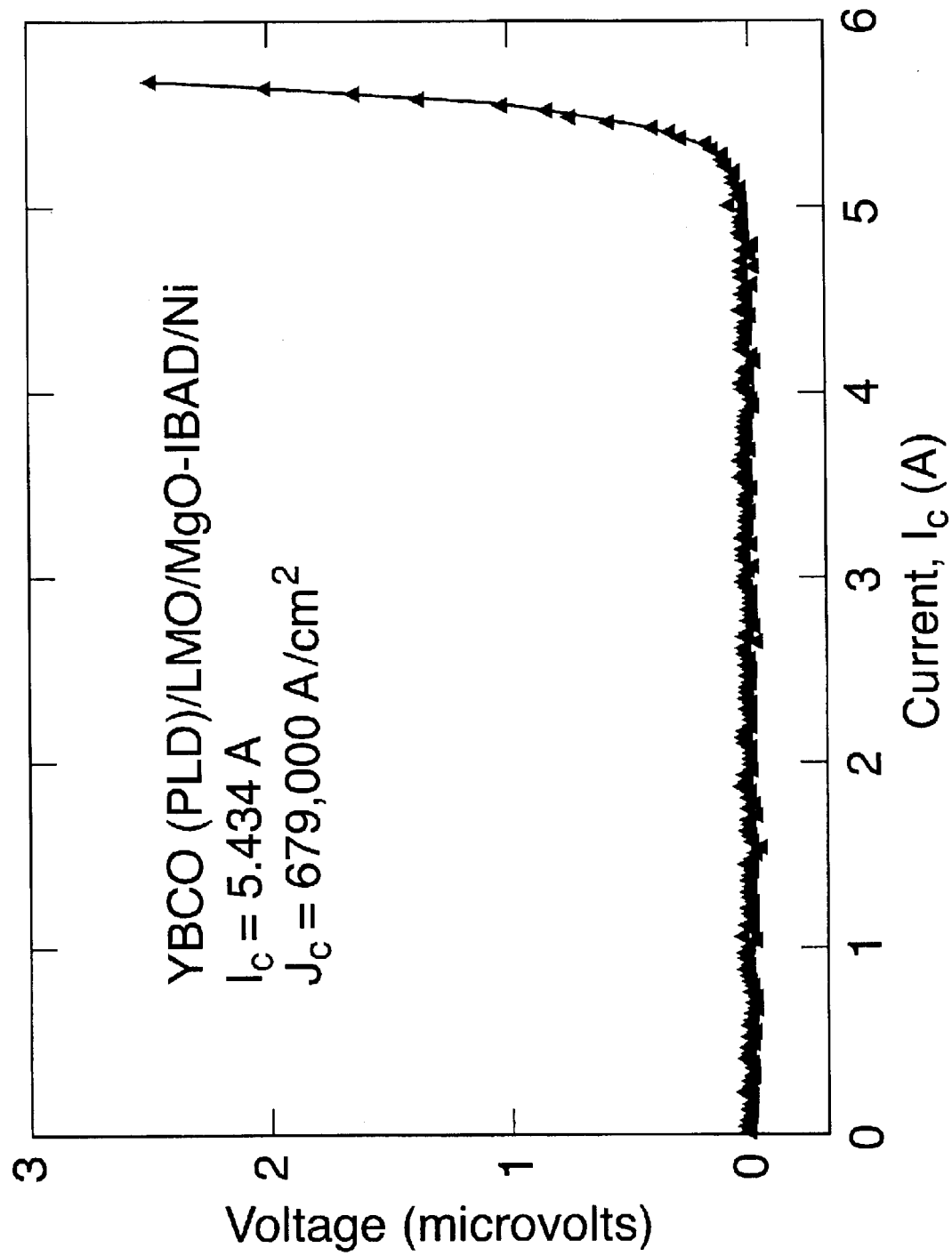
FIG. 7 is the I-V curve for a 200 nm thick PLD YBCO film LMO-buffered MgO (IBAD) substrates. The determined $J_c$ is 670,000 $A/cm^2$ at 77 K.

As shown in FIG. 1, it may be possible to develop various buffer layer architectures on MgO templates. FIG. 2 indicates the presence of c-axis aligned YBCO film on MgO (100) single crystal substrates. FIG. 3 indicates the presence of c-axis aligned YBCO film on LMO-buffered MgO single crystal substrates. The field dependence of critical current density, $J_c$ for a 200 nm thick PLD YBCO film on LMO-buffered MgO single crystal substrates is shown in FIG. 4. The YBCO film carried a $J_c$ of 4.1 MA/cm$^2$ at 77 K and self-field. The field dependence of critical current density, $J_c$ for a 330 nm thick YBCO film grown using the BF process on LMO-buffered MgO single crystal substrates is shown in FIG. 5. The YBCO film carried a $J_c$ of 4.32 MA/cm$^2$ at 77K and self-field. The $T_{o\ zero}$ for this YBCO film is around 90 K. This indicates that there is no interaction between LMO and YBCO layers. This is the first time it has been shown that the BF process is compatible with a layer other than CeO2. FIG. 6 indicates the presence of C-axis aligned LMO film on MgO(IBAD)/Ni-alloy substrates. The I-V curve for a 200 nm thick PLD YBCO film on LMO-buffered MgO (IBAD) substrates is shown in FIG. 7. The determined $J_c$ is 670,000 A/cm$^2$ at 77 K.

EXAMPLE II

Growth of LMO on a Metallic Substrate by Sputtering Followed by YBCO Deposition

In this example, the development of a suitable buffer layer architecture for $YBa_2Cu_3O_7$ (YBCO) coated conductors using the BF method to produce the YBCO is described. The architecture comprises LMO, as a buffer layer between the YBCO and a metallic substrate or a metallic substrate coated with a suitably selected additional buffer layer or buffer layer stack. The YBCO is deposited and epitaxially grown directly onto the LMO. To test the compatibility of LMO, a substrate was provided consisting of biaxially textured, rolled Ni tape coated with an epitaxial $Gd_2O_3$ buffer layer. A dense and crack-free layer of LMO was grown epitaxially onto the $Gd_2O_3$. A YBCO layer with a thickness of 0.3 µm then was grown onto the LMO using the BF method. First a non-superconducting precursor layer was deposited onto the LMO by electron-beam co-evaporation of Y, $BaF_2$, and Cu. The entire sample of metal, buffer layers, and precursor layer subsequently was annealed in a furnace to produce the superconducting and epitaxial YBCO layers. This layer carried a $J_c$ of about 0.9 MA/cm$^2$ at 77 K in self-field. In another test of compatibility, an epitaxial LMO layer was grown onto a (100) MgO single crystal substrate. An epitaxial YBCO layer was grown onto the LMO using the BF ex situ method. After the post-deposition anneal, this layer carried a $J_c$ greater than 4 MA/cm$^2$ at 77K in self-field. Thus, the synthesis of high-$J_c$ YBCO coatings on LMO buffer layers using the BF ex situ method has been reduced to practice.

In the first step, a precursor layer was deposited by electron-beam co-evaporation of Y, $BaF_2$, and Cu. The evaporation process was performed inside a vacuum chamber with an approximate background pressure of $10^{-6}$ to $10^{-5}$ Torr during the evaporation. The substrate was not intentionally heated during the evaporation process. In some cases, oxygen gas was flowed into the chamber to maintain the background pressure above the $10^{-6}$ Torr level. Using evaporation rate monitors and electronic feedback the composition of the precursor was controlled to approximately the optimal metal stoichiometry of YBCO.

The precursor layer was deposited directly onto the LMO buffer layer. In some cases, the LMO buffer layer was used as provided by the optimized LMO deposition process. In other cases, the substrate with the LMO buffer layer was annealed in a furnace before it was inserted into the vacuum chamber for precursor deposition. The anneals were performed in flowing nitrogen gas with measured residual oxygen concentrations less than 100 ppm. Annealing temperatures were in the range of 500° C. to 750° C. and the annealing time was about 0.5 h.

RF-magnetron sputtering was used to deposit LMO layers using the oxide targets. The sputter targets were made from the single phase LMO powders, prepared by solid-state reaction, which were loosely packed into a 4-inch copper tray. Typical sputter conditions consisted of $2 \times 10^{-5}$ to $5 \times 10^{-5}$ Torr of $H_2O$ with a total pressure of 3 mTorr forming gas (Ar/$H_2$ 4%). The LMO films were grown at a substrate temperature of 575° C. to 625° C. The water pressure provided was sufficient to oxidize the film to form shoichiometric LMO. The forming gas was used to reduce any oxide present at the substrate surface during the film growth. The LMO film thickness was varied from 600 Å to 3000 Å.

In the second step of the BF process, the precursor was annealed inside a furnace to form the YBCO epitaxial structure. The anneals were performed in flowing gas mixtures of nitrogen with added oxygen and water vapor. The total pressure inside the furnace was 1 atm. The oxygen partial pressure was about 0.0001 atm. to 0.0003 atm. The water concentration was balanced against parameters such as temperature, flow rate, furnace geometry, and size of the sample to provide suitable conversion kinetics and epitaxial growth. The annealing temperature was 745° C. The total gas flow rate was about 0.5 L/min. The water partial pressure was 0.24 atm. or less. A typical film thickness of the YBCO coating was 0.3 µm. The annealing duration for a sample with area of about 1 cm$^2$ was about 1 hr.

The structure of the YBCO coating was analyzed by X-ray diffraction. The electrical resistivity was measured using a four-probe technique. Electrical contacts were deposited onto the samples by dc sputtering followed by annealing in 1 atm oxygen for 30 min at 500° C. Values of $J_c$ were evaluated using a 1 µV/cm criterion.

Figure 8:
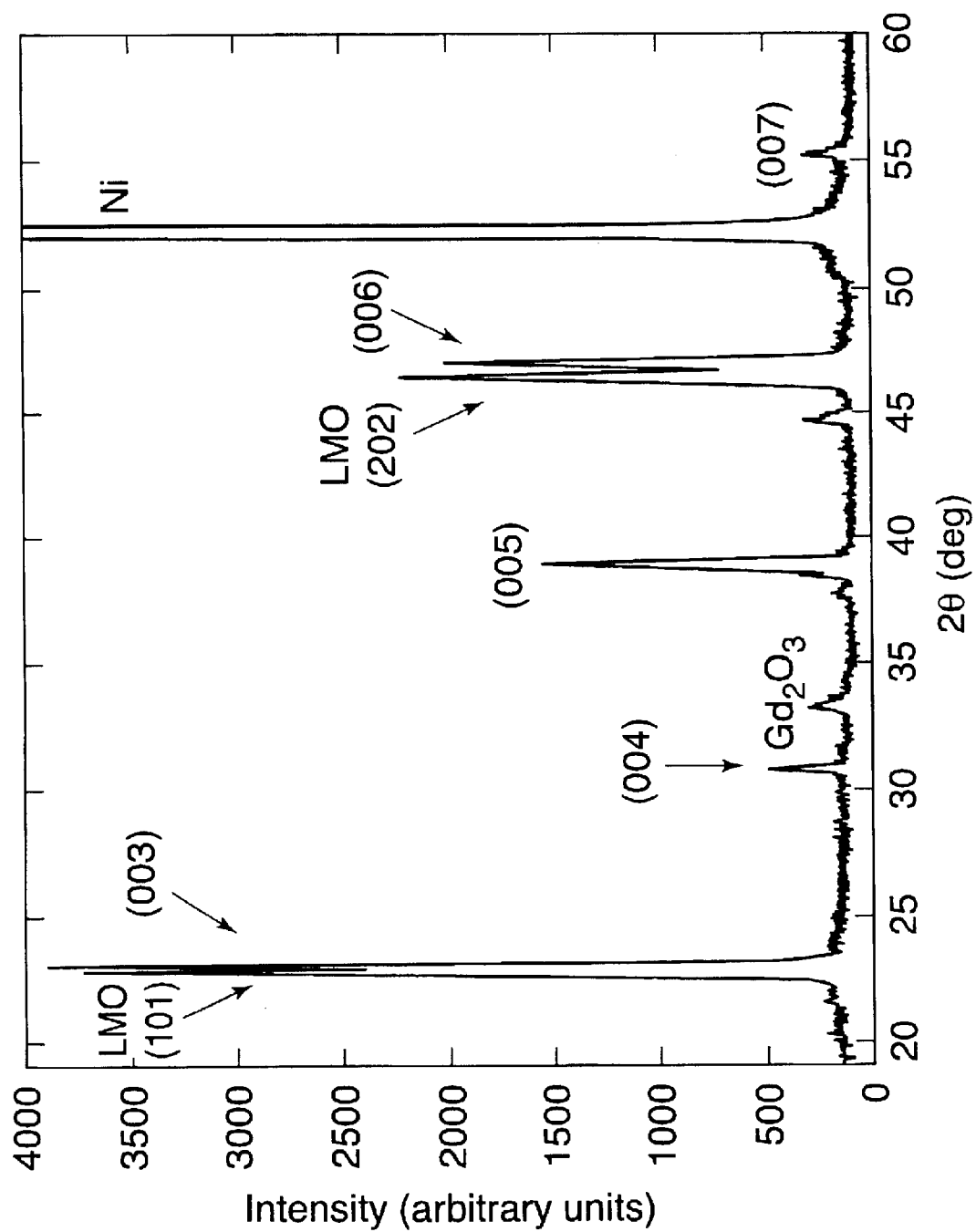
FIG. 8 is a typical XRD pattern of an epitaxial YBCO film produced by the BF process on a LMO buffer layer provided onto a substrate consisting of $Ni/Gd_2O_3$ (RABiTS).

In one sample, a YBCO epitaxial film was formed on a LMO buffer layer which was provided on a biaxially textured Ni substrate with epitaxial $Gd_2O_3$ intermediary buffer layer. The complete architecture of this substrate was: LMO/$Gd_2O_3$/Ni. The LMO thickness was about 200–300 nm. The YBCO had a resistivity of about 200–220 µΩ.cm at room temperature. The $J_c$ at 77K was about 870,000 A/cm$^2$ in the absence of an applied magnetic field. FIG. 8 indicates the presence of a c-axis aligned epitaxial YBCO film on the LMO buffered metal substrate.

In another sample, a YBCO epitaxial film was formed on a LMO buffer layer which was deposited onto a (100) MgO single crystal substrate. The LMO thickness was about 200–300 nm. The YBCO had a resistivity at room temperature of about 216 µΩ.cm. The $J_c$ at 77 K reached 4,400,000 A/cm$^2$ when no magnetic field was applied. These results show that high-$J_c$ epitaxial YBCO layers can be grown with the BF ex-situ process on LMO buffer layers.

EXAMPLE III

Growth of $RMnO_3$ on Textured Substrates where R Comprises at Least One of Ce, Pr, Nd, Pm, Sm, Eu, Gd, Tb, Dy, Ho, Er, Tm, Yb, Lu, and Y Very recent reports indicate and confirm that many new compounds besides LMO exist in the general chemical formula $RMnO_3$, where R can be Ce, Pr, Nd, Pm, Sm, Eu, Gd, Tb, Dy, Ho, Er, Tm, Yb, Lu, or Y. $RMnO_3$ compounds crystallize in orthorhombic structure [space group Pbnm ($D^{16}_{2h}$) and Z=4] for R with larger ionic radius where R may be La, Ce, Pr, Nd, Pm, Sm, Eu, Gd, Tb, or Dy. For further details, refer to L. Martin-Carron, A. de Andres, M. J.

Martiniz-Lope, M. T. Casais, and J. A. Alonso, J. of Alloy and Compounds, 323–324 (2001) 494–497. For this set, the ionic radius varies between 1.15 Å and 0.99 Å.

For compounds with smaller ionic radius (R may be Ho, Er, or Y), either the orhorhombic or the hexagonal structure [space group $P6_3cm(C^3_{6v})$ and Z=7] can be obtained. For further details, refer to M. N. Iliev, H. G. Lee, V. N. Popov, M. V. Abrashev, A. Hamed, R. Meng and C. W. Chu, Phys. Rev. B, 56(1997)2488–2494. In this case the orthorhombic structure is of interest.

Next, it is also of interest to dope the compound to make it electronically conducting to give the formula, $R_{1-x}A_xMnO_3$, wherein A is an element selected from the group consisting of Be, Mg, Ca, Sr, Ba, and Ra.

In particular doping of Ca and Sr is of significant interest since doping of Ca and Sr has also been reported as beneficial in mitigating weak-link behavior in YBCO.

Next, the $RMnO_3$ or $R_{1-x}A_xMnO_3$ could be deposited epitaxially on biaxially textured surfaces or MgO or other IBAD or ISD or ITEX produced biaxially textured surfaces on untextured metals.

Lastly, next, these $RMnO_3$ or $R_{1-x}A_xMnO_3$ could be deposited epitaxially on biaxially textured metals and alloys with or without a seed buffer layer.

Finally any of a broad variety of electronic devices including, but not limited to $REBa_2Cu_3O_7$, superconductors, semiconductors, and ferroelectric materials as well as other electronic devices known to the skilled artisan can be deposited on top of these $RMnO_3$ or $R_{1-x}A_xMnO_3$ buffer layers. Some may be selected from $REBa_2Cu_3O_7$ where RE is a rare earth element; and $(Bi, Pb)_1Sr_2Ca_{n-1}Cu_nO_{2n+2}$, where n is an integer between 1 and 4; $(Tl,Pb)_1Ba_2Ca_{n-1}Cu_nO_{2n+3}$, where n is an integer between 1 and 4; and $(Hg,Tl,Pb)_1Ba_2Ca_{n-1}Cu_nO_{2n+2}$, where n is an integer between 1 and 4. Any in-situ or ex-situ technique can be used to deposit the electronic device.

EXAMPLE IV

Growth of MgO on a Biaxially Textured Metal Substrate by e-beam Evaporation Followed by $LaMnO_3$ (Using Sputtering) and YBCO Deposition An electron beam (e-beam) evaporation technique was used to deposit Magnesium Oxide, MgO films directly on biaxially textured Cu or Cu-alloys or Ni or Ni-alloys. The as-rolled Cu substrates were cleaned ultrasonically with both acetone and methanol and recrystallized to the desired {100}<001> cube texture by annealing the substrates at 800° C. for 1 hour in a vacuum of $10^{-6}$ Torr. Biaxially oriented Cu substrates were mounted on a substrate holder with a heater assembly in the e-beam system. After the vacuum in the chamber had reached $1\times10^{-6}$ Torr at room temperature, the substrate was then heated in the range of 300 to 700° C. and MgO layers were deposited at that temperature. The preferred deposition temperature is about 400° C. After the deposition, the film was heated to about 600° C. and cooled to room temperature. Graphite liner was used as the crucible. Magnesium Oxide crystals were used as the source. To understand the chemistry of the oxide formation, a SRS RGA100 Residual gas analyzer was mounted in the e-beam system. The background $H_2O$ pressure was around $1\times10^{-5}$ Torr. The deposition rate for MgO was about 5 Å/sec with the operating pressure of about $10^{-5}$ Torr, and the final thickness was varied from 200 Å to 1500 Å. The rf magnetron sputtering technique was used to grow $LaMnO_3$ or $R_{1-x}A_xMnO^3$ on e-beam grown MgO-buffered Cu substrates at about 550° C. The pulsed laser deposition technique was used to grow YBCO at about 780° C. and about 185 mTorr $O_2$ on sputtered $LaMnO_3$ or $R_{1-x}A_xMnO_3$ layers.

Figure 15:
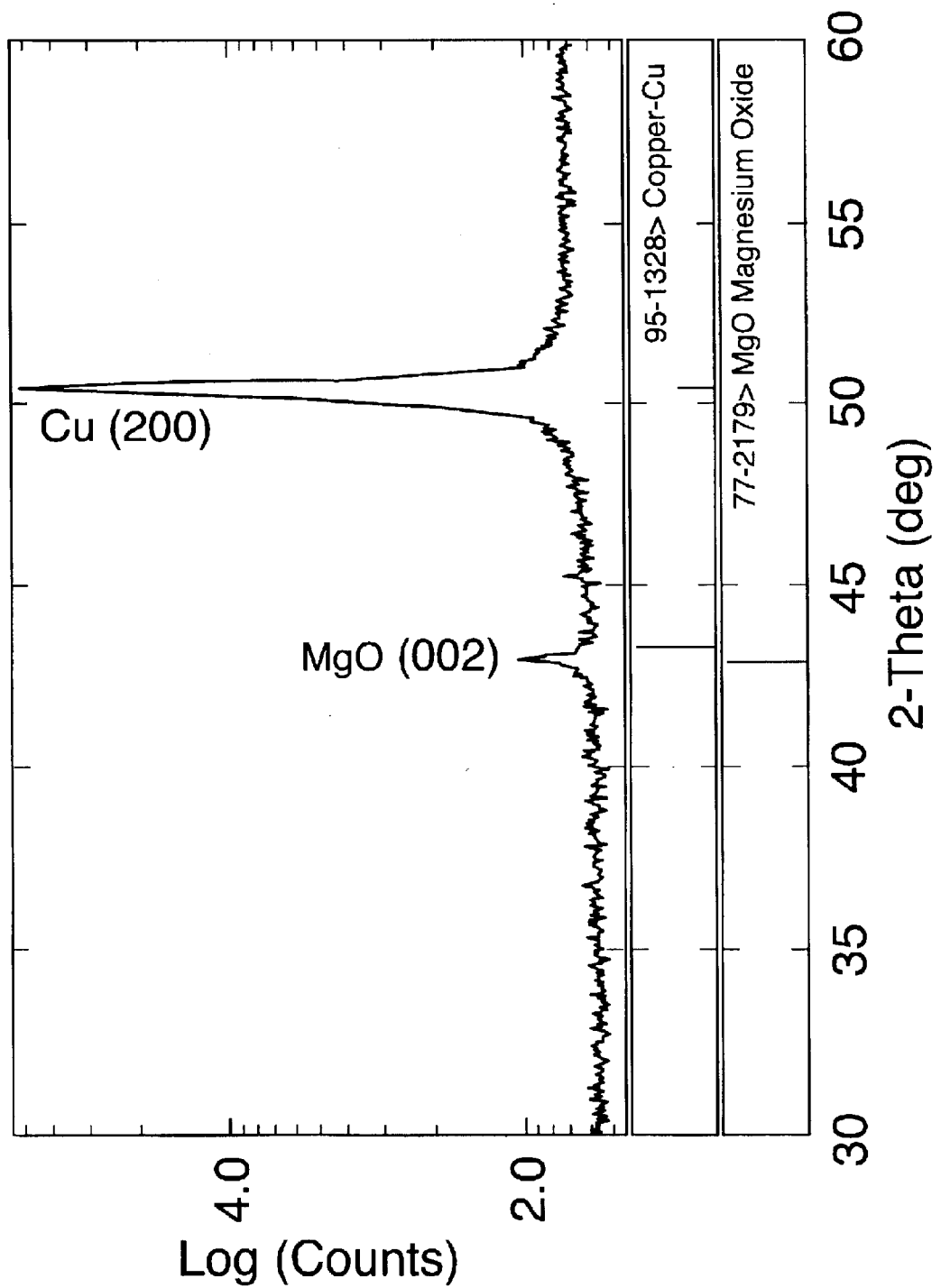
FIG. 15 is a typical θ-2θ scan for a 1500 Å thick MgO film on a textured-Ni (100) substrate.

The films were analyzed by X-ray diffraction. A Philips Model XRG3100 diffractometer with Cu $K_\alpha$ radiation was used to record powder diffraction patterns. For texture analysis, a Rigaku rotating anode X-ray generator was used, with a graphite monochromator selecting Cu $K_\alpha$ radiation, and slits defining a 2×2 mm² incident beam. A four-circle diffractometer was used to collect pole figures, ω scans, and φ scans. SEM micrographs were taken using a Hitachi S-4100 Field Emission Scanning Electron Microscope. The beam voltage used was about 15 kV. The thickness of the films was determined both by Rutherford Backscattering Spectroscopy (RBS) and Alpha Step Profilometer scans. A typical θ-2θ scan for a 1500 Å thick MgO film on a textured-Ni (100) substrate is shown in FIG. 15. The strong MgO (002) from FIG. 15 revealed the presence of a good out-of-plane texture.

While there has been shown and described what are at present considered the preferred embodiments of the invention, it will be obvious to those skilled in the art that various changes and modifications can be made therein without departing from the scope of the inventions defined by the appended claims.

We claim:

1. A buffered substrate for electronic devices comprising:
   a. A substrate selected from the group consisting of biaxially textured metals, biaxially textured metal alloys, and biaxially textured metal oxides, said substrate having at least one surface; and
   b. a buffer layer disposed epitaxially upon a surface of said substrate, said buffer layer comprising at least one buffer selected from the group consisting of $RMnO_3$ and $R_{1-x}A_xMnO_3$, wherein R comprises at least one element selected from the group consisting of Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra.

2. A buffered substrate for electronic devices comprising:
   a. A substrate selected from the group consisting of biaxially textured metals, biaxially textured metal alloys, and biaxially textured metal oxides, said substrate having at least one surface;
   b. At least one biaxially textured buffer layer disposed epitaxially upon a surface of said substrate; and
   c. an additional buffer layer disposed epitaxially upon a surface of said biaxially textured buffer layer, said additional buffer layer comprising at least one buffer selected from the group consisting of $RMnO_3$ and $R_{1-x}A_xMnO_3$, wherein R comprises at least one element selected from the group consisting of Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra.

3. A buffered substrate for electronic devices comprising:
   a. A substrate selected from the group consisting of metals and metal alloys, said substrate having a surface characterized by non-biaxial texture;
   b. At least one biaxially textured buffer layer disposed upon a surface of said substrate; and
   c. an additional buffer layer disposed epitaxially upon a surface of said biaxially textured buffer layer, said additional buffer layer comprising at least one buffer selected from the group consisting of $RMnO_3$ and $R_{1-x}A_xMnO_3$, wherein R comprises at least one element selected from the group consisting of Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra.

4. A buffered substrate for electronic devices comprising:
   a. A single crystal substrate, said substrate having at least one surface; and
   b. a buffer layer disposed epitaxially upon a surface of said single crystal substrate, said buffer layer comprising at least one buffer selected from the group consisting of $RMnO_3$ and $R_{1-x}A_xMnO_3$, wherein R comprises at least one element selected from the group consisting of Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra.

5. An electronic device comprising:
   a. A substrate selected from the group consisting of biaxially textured metals, biaxially textured metal alloys, and biaxially textured metal oxides, said substrate having at least one surface;
   b. a buffer layer disposed epitaxially upon a surface of said substrate, said buffer layer comprising at least one buffer selected from the group consisting of $RMnO_3$ and $R_{1-x}A_xMnO_3$, wherein R comprises at least one element selected from the group consisting of Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra; and,
   c. At least one electronic device disposed upon a surface of said buffer layer, said electronic device being selected from the group consisting of $REBa_2Cu_3O_7$, a superconductor, a semiconductor, and a ferroelectric material.

6. An electronic device comprising:
   a. A substrate selected from the group consisting of biaxially textured metals, biaxially textured metal alloys, and biaxially textured metal oxides, the said substrate having at least one surface;
   b. At least one biaxially textured buffer layer disposed epitaxially upon a surface of said substrate;
   c. an additional buffer layer disposed epitaxially upon a surface of said biaxially textured buffer layer, said additional buffer layer comprising at least one buffer selected from the group consisting of $RMnO_3$ and $R_{1-x}A_xMnO_3$, wherein R comprises at least one element selected from the group consisting of Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra; and,
   d. At least one electronic device disposed upon a surface of said additional buffer layer, said electronic device being selected from the group consisting of $REBa_2Cu_3O_7$, a superconductor, a semiconductor, and a ferroelectric material.

7. An electronic device comprising:
   a. A substrate selected from the group consisting of metals and metal alloys, said substrate having a surface characterized by non-biaxial texture;
   b. At least one biaxially textured buffer layer disposed upon a surface of said substrate;
   c. an additional buffer layer disposed epitaxially upon a surface of said biaxially textured buffer layer, said additional buffer layer comprising at least one buffer selected from the group consisting of $RMnO_3$ and $R_{1-x}A_xMnO_3$, wherein R comprises at least one element selected from the group consisting of Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra; and,
   d. At least one electronic device disposed upon a surface of said additional buffer layer, said electronic device being selected from the group consisting of $REBa_2Cu_3O_7$, a superconductor, a semiconductor, and a ferroelectric material.

8. An electronic device comprising:
   a. A single crystal substrate, said substrate having at least one surface;
   b. a buffer layer disposed epitaxially upon a surface of said single crystal substrate, said buffer layer comprising at least one buffer selected from the group consisting of $RMnO_3$ and $R_{1-x}A_xMnO_3$, wherein R comprises at least one element selected from the group consisting of Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra; and,
   c. At least one electronic device disposed upon a surface of said buffer layer, said electronic device being selected from the group consisting of $REBa_2Cu_3O_7$, a superconductor, a semiconductor, and a ferroelectric material.

9. A buffered substrate for electronic devices comprising:
   a. A substrate selected from the group consisting of biaxially textured metals, biaxially textured metal alloys, and biaxially textured metal oxides, said substrate having at least one surface; and
   b. a buffer layer of $La_{1-x}A_xMnO_3$ disposed epitaxially upon a surface of said substrate, wherein A comprises at least one element selected from the group consisting of Be, Mg, and Ra.

10. A buffered substrate for electronic devices comprising:
    a. A substrate selected from the group consisting of biaxially textured metals, biaxially textured metal alloys, and biaxially textured metal oxides, said substrate having at least one surface;
    b. At least one biaxially textured buffer layer disposed epitaxially upon a surface of said substrate; and
    c. an additional buffer layer of $La_{1-x}A_xMnO_3$ disposed epitaxially upon a surface of said biaxially textured buffer layer, wherein A comprises at least one element selected from the group consisting of Be, Mg, and Ra.

11. A buffered substrate for electronic devices comprising:
    a. A substrate selected from the group consisting of metals and metal alloys, said substrate having a surface characterized by non-biaxial texture;
    b. At least one biaxially textured buffer layer disposed upon a surface of said substrate; and
    c. a buffer layer of $La_{1-x}A_xMnO_3$ disposed epitaxially upon a surface of said substrate wherein A comprises at least one element selected from the group consisting of Be, Mg, and Ra.

12. A buffered substrate for electronic devices comprising:
    a. A single crystal substrate, said substrate having at least one surface; and
    b. a buffer layer of $La_{1-x}A_xMnO_3$ disposed epitaxially upon a surface of said single crystal substrate, wherein A comprises at least one element selected from the group consisting of Be, Mg, and Ra.

13. An electronic device comprising:
   a. A substrate selected from the group consisting of biaxially textured metals, biaxially textured metal alloys, and biaxially textured metal oxides, said substrate having at least one surface;
   b. a buffer layer of $La_{1-x}A_xMnO_3$ disposed epitaxially upon a surface of said substrate, wherein A comprises at least one element selected from the group consisting of Be, Mg, and Ra; and,
   c. At least one electronic device disposed upon a surface of said buffer layer, said electronic device being selected from the group consisting of $REBa_2Cu_3O_7$, a superconductor, a semiconductor, and a ferroelectric material.

14. An electronic device comprising:
   a. A substrate selected from the group consisting of biaxially textured metals, biaxially textured metal alloys, and biaxially textured metal oxides, said substrate having at least one surface;
   b. At least one biaxially textured buffer layer disposed epitaxially upon a surface of said substrate;
   c. an additional buffer layer of $La_{1-x}A_xMnO_3$ disposed epitaxially upon a surface of said biaxially textured buffer layer, wherein A comprises at least one element selected from the group consisting of Be, Mg, and Ra; and,
   d. At least one electronic device disposed upon a surface of said additional buffer layer, said electronic device being selected from the group consisting of $REBa_2Cu_3O_7$, a superconductor, a semiconductor, and a ferroelectric material.

15. An electronic device comprising:
   a. A substrate selected from the group consisting of metals and meal alloys, said substrate having a surface characterized by non-biaxial texture;
   b. At least one biaxially textured buffer layer disposed upon a surface of said substrate;
   c. a buffer layer of $La_{1-x}A_xMnO_3$ disposed epitaxially upon a surface of said substrate, wherein A comprises at least one element selected from the group consisting of Be, Mg, and Ra; and,
   d. At least one electronic device disposed upon a surface of said additional buffer layer, said electronic device being selected from the group consisting of $REBa_2Cu_3O_7$, a superconductor, a semiconductor, and a ferroelectric material.

16. An electronic device comprising:
   a. A single crystal substrate, said substrate having at least one surface;
   b. a buffer layer of $La_{1-x}A_xMnO_3$ disposed epitaxially upon a surface of said single crystal substrate, wherein A comprises at least one element selected from the group consisting of Be, Mg, and Ra; and,
   c. At least one electronic device disposed upon a surface of said buffer layer, said electronic device being selected from the group consisting of $REBa_2Cu_3O_7$, a superconductor, a semiconductor, and a ferroelectric material.

17. A buffered substrate for electronic devices comprising:
   a. A substrate selected from the group consisting of biaxially textured metals, biaxially textured metal alloys, and biaxially textured metal oxides, said substrate having at least one surface;
   b. At least one biaxially textured MgO buffer layer disposed epitaxially upon a surface of said substrate; and
   c. an additional buffer layer disposed epitaxially upon a surface of said biaxially textured buffer layer, said additional buffer layer comprising at least one buffer selected from the group consisting of $RMnO_3$ and $R_{1-x}A_xMnO_3$, when R comprises at least one element selected from the group consisting of La, Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra.

18. A buffered substrate for electronic devices comprising:
   a. A substrate selected from the group consisting of metals and metal alloys, said substrate having a surface characterized by non-biaxial texture;
   b. At least one biaxially textured MgO buffer layer disposed upon a surface of said substrate; and
   c. an additional buffer layer disposed epitaxially upon a surface of said biaxially textured buffer layer, said additional buffer layer comprising at least one buffer selected from the group consisting of $RMnO_3$ and $R_{1-x}A_xMnO_3$, wherein R comprises at least one element selected from the group consisting of La, Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra.

19. A buffered substrate for electronic devices comprising:
   a. A single crystal MgO substrate, said substrate having at least one surface; and
   b. a buffer layer disposed epitaxially upon a surface of said single crystal substrate, said buffer layer comprising at least one buffer selected from the group consisting of $RMnO_3$ and $R_{1-x}A_xMnO_3$, wherein R comprises at least one element selected from the group consisting of La, Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra.

20. An electronic device comprising;
   a. A substrate selected from the group consisting of biaxially textured metals, biaxially textured metal alloys, and biaxially textured metal oxides, said substrate having at least one surface;
   b. At least one biaxially textured MgO buffer layer disposed epitaxially upon a surface of said substrate;
   c. an additional buffer layer disposed epitaxially upon a surface of said biaxially textured buffer layer, said additional buffer layer comprising at least one buffer selected from the group consisting of $RMnO_3$ and $R_{1-x}A_xMnO_3$, wherein R comprises at least one element selected from the group consisting of La, Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra; and,
   d. At least one electronic device disposed upon a surface of said additional buffer layer, said electronic device being selected from the group consisting of $REBa_2Cu_3O_7$, a superconductor, a semiconductor, and a ferroelectric material.

21. An electronic device comprising:
a. A substrate selected from the group consisting of metals and metal alloys, said substrate having a surface characterized by non-biaxial texture;
b. At leas one biaxially textured MgO buffer layer disposed upon a surface of said substrate;
c. an additional buffer layer disposed epitaxially upon a surface of said biaxially textured buffer layer, said additional buffer layer comprising at least one buffer selected from the group consisting of $RMnO_3$ and $R_{1-x}A_xMnO_3$, wherein R comprises at least one element selected from the group consisting of La, Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra; and,
d. At least one electronic device disposed upon a surface of said additional buffer layer, said electronic device being selected from the group consisting of $REBa_2Cu_3O_7$, a superconductor, a semiconductor, and a ferroelectric material.

22. An electronic device comprising;
a. A single crystal MgO substrate, said substrate having at least one surface;
b. a buffer layer disposed epitaxially upon a surface of said single crystal substrate, said buffer layer comprising at least one buffer selected from the group consisting of $RMnO_3$ and $R_{1-x}A_xMnO_3$, wherein R comprises at least one element selected from the group consisting of La, Ce, Pr, Nd, Pm, Sm, Eu, Gd, Tb, Dy, Ho, Er, Tm, Yb, Lu, and Y, and A comprises at least one element selected from the group consisting of Be, Mg, Ca, Sr, Ba, and Ra; and,
c. At least one electronic device disposed upon a surface of said buffer layer, said electronic device being selected from the group consisting of $REBa_2Cu_3O_7$, a superconductor, a semiconductor, and a ferroelectric material.

* * * * *